(12) United States Patent
Deng et al.

(10) Patent No.: US 11,488,754 B2
(45) Date of Patent: Nov. 1, 2022

(54) SUPERCONDUCTING BULK COOLING APPARATUS AND COOLING METHOD FOR HIGH-TEMPERATURE SUPERCONDUCTING MAGNETIC LEVITATION VEHICLE

(71) Applicant: Southwest Jiaotong University, Chengdu (CN)

(72) Inventors: Zigang Deng, Chengdu (CN); Shaolei Sun, Chengdu (CN); Yanzhi Liu, Chengdu (CN); Jun Zheng, Chengdu (CN)

(73) Assignee: SOUTHWEST JIAOTONG UNIVERSITY, Chengdu (CN)

( * ) Notice: Subject to any disclaimer, the term of this patent is extended or adjusted under 35 U.S.C. 154(b) by 0 days.

(21) Appl. No.: 17/539,426

(22) Filed: Dec. 1, 2021

(65) Prior Publication Data
US 2022/0093300 A1  Mar. 24, 2022

(30) Foreign Application Priority Data
Jun. 17, 2021  (CN) .......................... 202110669869.5

(51) Int. Cl.
*H05K 7/20* (2006.01)
*H01F 6/04* (2006.01)
(Continued)

(52) U.S. Cl.
CPC .............. *H01F 6/04* (2013.01); *F16L 59/147* (2013.01); *F25D 19/006* (2013.01); *H05K 7/20336* (2013.01); *H05K 7/20881* (2013.01)

(58) Field of Classification Search
CPC ........ H01F 6/04; F16L 59/147; F25D 19/006; H05K 7/20336; H05K 7/20881
See application file for complete search history.

(56) References Cited

U.S. PATENT DOCUMENTS

| 2013/0203603 A1* | 8/2013 | Harrison ................... H01F 6/04 324/318 |
| 2014/0158683 A1 | 6/2014 | Horiuchi et al. |

(Continued)

FOREIGN PATENT DOCUMENTS

| CN | 1897173 A | 1/2007 |
| CN | 201975194 U | 9/2011 |

(Continued)

*Primary Examiner* — David J Teitelbaum
(74) *Attorney, Agent, or Firm* — Wayne IP LLC

(57) ABSTRACT

The present invention discloses a superconducting bulk cooling apparatus and cooling method for a high-temperature superconducting magnetic levitation vehicle. The superconducting bulk cooling apparatus for the high-temperature superconducting magnetic levitation vehicle includes a refrigerating machine, a vacuum box and a Dewar tank. A condensing tank is arranged in the vacuum box, and the condensing tank is communicated with the Dewar tank through a nitrogen siphon pipe and a liquid nitrogen return pipe; a heat exchanger connected with the refrigerating machine is arranged in the condensing tank; and a flexible isolation pipe for thermally insulating and isolating the nitrogen siphon pipe and the liquid nitrogen return pipe is connected between the vacuum box and the Dewar tank. The present invention pumps the phase-change nitrogen out of the Dewar tank through a siphoning effect, so that the immersion cooling of high-temperature superconducting bulks is separated from the re-condensation of the nitrogen.

10 Claims, 3 Drawing Sheets

(51) Int. Cl.
*F16L 59/147* (2006.01)
*F25D 19/00* (2006.01)

(56) References Cited

U.S. PATENT DOCUMENTS

| | | | |
|---|---|---|---|
| 2014/0357492 A1* | 12/2014 | Dai | H01F 5/02 |
| | | | 505/211 |
| 2015/0015260 A1* | 1/2015 | Harrison | H01F 6/06 |
| | | | 324/318 |
| 2017/0038123 A1* | 2/2017 | Strickland | F25B 9/00 |
| 2017/0205124 A1* | 7/2017 | Staines | F25D 19/00 |
| 2018/0111505 A1* | 4/2018 | Caron | B60L 13/04 |
| 2019/0212049 A1* | 7/2019 | Strobel | F25D 19/006 |

FOREIGN PATENT DOCUMENTS

| | | |
|---|---|---|
| CN | 102798304 A | 11/2012 |
| CN | 104482357 A | 4/2015 |
| CN | 108352372 A | 7/2018 |
| CN | 208157189 U | 11/2018 |
| CN | 109243752 A | 1/2019 |
| CN | 109411148 A | 3/2019 |
| CN | 109712774 A | 5/2019 |
| CN | 110107777 A | 8/2019 |
| EP | 0905524 A1 | 3/1999 |

\* cited by examiner

SUPERCONDUCTING BULK COOLING APPARATUS AND COOLING METHOD FOR HIGH-TEMPERATURE SUPERCONDUCTING MAGNETIC LEVITATION VEHICLE

CROSS-REFERENCE TO RELATED APPLICATIONS

This application claims the benefit of priority from Chinese Patent Application No. 202110669869.5, filed on Jun. 17, 2021. The content of the aforementioned application, including any intervening amendments thereto, is incorporated herein by reference in its entirety.

TECHNICAL FIELD

The present invention relates to the technical field of rail transportation equipment, and particularly relates to a superconducting bulk cooling apparatus and cooling method for a high-temperature superconducting magnetic levitation vehicle.

BACKGROUND OF THE PRESENT INVENTION

High-temperature superconducting magnetic levitation vehicles are one of main applications of the superconducting magnetic levitation technology, and have the characteristic of achieving stable levitation without external control. They have the advantages of energy conservation, environmental protection, wide speed application range and the like, and have vast development space compared with wheel-rail trains. As the core of the superconducting magnetic levitation system, the structural design of a cryogenic system directly affects the performance of the superconducting bulk and further affects the running performance of the vehicle. At present, the vehicle-mounted cryogenic systems mainly include a liquid nitrogen immersion type and a refrigerating machine conduction cooling type. However, for the liquid nitrogen immersion cooling method, the liquid nitrogen may be continuously phase-changed into gaseous nitrogen with the increase of temperature in the working process. Therefore, it is necessary to regularly replenish the liquid nitrogen to a low-temperature thermostat, and the long-time and repeated replenishing process reduces the running efficiency of the vehicle, which is unfavorable for the engineering application.

The conduction cooling of the refrigerating machine is to directly contact the high-temperature superconducting bulk through a cold head of the refrigerating machine and to further transfer the cold directly to the high-temperature superconducting bulk, but the refrigerating machine needs a long time to reach the target temperature to further cool the high-temperature superconducting bulk; at the same time, and the contact area between the cold head of the refrigerating machine and the high-temperature superconducting bulk is limited, thereby limiting the heat conduction efficiency between the two, so that the running cost is high. In the prior art, the heat efficiency is improved generally by adding additional components, optimizing a connecting structure and the like, thereby leading to the excessively large size of the equipment, and the excessively large size seriously affects the normal installation of the cooling equipment because the space of the vehicle for installing the cooling equipment is limited.

SUMMARY OF THE PRESENT INVENTION

For the defects of low running efficiency and low heat efficiency in the prior art, the present invention discloses a superconducting bulk cooling apparatus and cooling method for a high-temperature superconducting magnetic levitation vehicle. Particularly, the structural design and layout of components in the present invention, and the selection of various parameters are based on the existing high-temperature superconducting magnetic levitation vehicle; by adopting technical solutions of the present invention, the running efficiency of the cooling apparatus can be improved effectively, and at the same time, a cooling environment with small temperature fluctuation is provided, thereby improving the cooling quality for the high-temperature superconducting bulk; and further, the running efficiency of the high-temperature superconducting magnetic levitation vehicle is improved, and the manual maintenance frequency of the high-temperature superconducting magnetic levitation vehicle is reduced.

The present invention adopts the following technical solutions to realize the above purpose:

A superconducting bulk cooling apparatus for a high-temperature magnetic levitation vehicle includes a refrigerating machine, a vacuum box, and a Dewar tank. A condensing tank is arranged in the vacuum box, and the condensing tank is thermally insulated from an external environment through a vacuum low-temperature environment in the vacuum box.

The Dewar tank is communicated with the vacuum box through a flexible isolation pipe, and a nitrogen siphon pipe and a liquid nitrogen return pipe that are separated from each other are arranged in the flexible isolation pipe; and the Dewar tank is communicated with the condensing tank through the nitrogen siphon pipe and the liquid nitrogen return pipe to form a closed nitrogen conversion and circulation loop.

A heat exchanger for performing heat exchange and condensation on gaseous nitrogen is arranged in the condensing tank, and the heat exchanger is fixedly and thermally connected with the refrigerating machine; and liquid nitrogen condensed on cooling fins of the heat exchanger is returned to the Dewar tank via the liquid nitrogen return pipe on the bottom of the condensing tank under the action of the gravity to replenish the liquid nitrogen for cooling.

Preferably, the flexible isolation pipe includes an inner pipe and an outer pipe made of a corrugated pipe, the inner pipe and the outer pipe are concentrically arranged, and a thermal insulation layer is filled between the inner pipe and the outer pipe; and a plurality of fixing sheets for supporting the nitrogen siphon pipe and the liquid nitrogen return pipe are arranged in the inner pipe, and an isolation gap is reserved between any two of the nitrogen siphon pipe, the liquid nitrogen return pipe and the inner pipe through the fixing sheets.

Preferably, a plurality of pipeline supporting sheets are uniformly arranged between the inner pipe and the outer pipe, and the thermal insulation layer is filled between adjacent pipeline supporting sheets.

Preferably, the vacuum box includes a box body and a top cover that are connected with each other. The refrigerating machine is fixedly connected with the top cover through a damper; and the condensing tank includes a tank body, the top of the tank body is provided with a heat exchanger, and a cold head of the refrigerating machine passes through the top cover to be thermally connected with the heat exchanger.

Preferably, the cold head is provided with a heating pipe for controlling the output cold thereof, and the heating pipe is also connected with a temperature controller for controlling the heating temperature.

Preferably, the condensing tank is also provided with a liquid nitrogen replenishing pipe communicated with an external liquid nitrogen source. The liquid nitrogen replenishing pipe is provided with a regulating stop valve. The liquid nitrogen replenishing pipe is also provided with a corrugated compensation pipe.

Preferably, the condensing tank is also connected with a safety pipe communicated with the external environment. The safety pipe is provided with a safety valve for controlling a connection/disconnection state thereof. The safety pipe is also connected with a first vacuum pipe in parallel, and the vacuum pipe is provided with a first stop valve.

Preferably, the vacuum box is also provided with a detecting pipe and a second vacuum pipe that are communicated with the exterior. The detecting pipe is connected with a vacuum gauge and an aviation joint respectively. A temperature sensor connected with the aviation joint is arranged in the vacuum box. The second vacuum pipe is provided with a second stop valve.

Preferably, the heat exchanger includes a connecting seat, and a plurality of cooling fins are uniformly arranged on the connecting seat; an outlet end of the nitrogen siphon pipe is right opposite to the cooling fins; and a cross-section of each cooling fin is in an inverted triangular shape or an inverted trapezoidal shape, and an oblique angle of a side surface is $0.25°$-$0.5°$.

Correspondingly, the present invention also discloses a superconducting bulk cooling method for a high-temperature superconducting magnetic levitation vehicle, which includes the following steps:

S1, placing high-temperature superconducting bulks into a Dewar tank;

S2, connecting a vacuum pump with a first vacuum pipe, opening a first stop valve at the same time, vacuumizing a vacuum box through the vacuum pump, stopping relevant operations after the vacuum degree is qualified through the detection with the vacuum gauge, and closing the first stop valve;

S3, connecting the vacuum pump with a second vacuum pipe, opening a second stop valve at the same time, vacuumizing a condensing tank, a nitrogen siphon pipe and a liquid nitrogen return pipe through the vacuum pump, and closing the second stop valve after finishing the operation;

S4, starting a refrigerating machine, reducing the internal temperature of the condensing tank through the refrigerating machine, and detecting the temperature through a temperature sensor to ensure that the temperature in the tank is stabilized at a nitrogen liquefied temperature; pumping saturated nitrogen generated by the phase change in a cooling process of the high-temperature superconducting bulk into the condensing tank through a siphon effect, condensing the nitrogen into liquid nitrogen, and returning the liquid nitrogen into the Dewar tank through the liquid nitrogen return pipe to replenish the liquid nitrogen for cooling.

Compared with the prior art, the present invention has the following beneficial effects:

1. The present invention includes the refrigerating machine, the vacuum box and the Dewar tank. The condensing tank is arranged in the vacuum box, and the condensing tank is communicated with the Dewar tank through the nitrogen siphon pipe and the liquid nitrogen return pipe to form the closed nitrogen circulation loop; the heat exchanger connected with the refrigerating machine is arranged in the condensing tank; and the flexible isolation pipe for thermally insulating and isolating the nitrogen siphon pipe and the liquid nitrogen return pipe is also connected between the vacuum box and the Dewar tank.

When the present invention is in use, the nitrogen siphon pipe and the liquid nitrogen return pipe that are separated from each other to form the closed nitrogen circulation loop between the condensing tank and the Dewar tank accelerates the nitrogen circulation, thereby improving the heat exchange efficiency; and the liquid nitrogen return pipe is arranged at the bottom of the condensing tank, the liquid nitrogen condensed on the cooling fins of the heat exchanger is returned to the Dewar tank via the liquid nitrogen return pipe at the bottom of the condensing tank under the action of gravity to replenish the liquid nitrogen for cooling, so that a purpose that the liquid nitrogen is returned immediately after condensation is achieved, thereby improving the liquid nitrogen return rate, and improving the running efficiency of the apparatus.

When the present invention is in use, the Dewar tank is filled with the liquid nitrogen, the high-temperature superconducting bulks are immersed for cooling in the liquid nitrogen of the Dewar tank at the same time, and the temperature of the liquid nitrogen increases in the cooling process, so that partial liquid nitrogen is phase-changed into saturated nitrogen, the pressure in the Dewar tank increases continuously, the siphoning effect occurs between the condensing tank and the Dewar tank due to the pressure difference between the condensing tank and the Dewar tank, and the saturated nitrogen overcomes the surface tension thereof to automatically enter the condensing tank through the nitrogen siphon pipe so as to cool and thermally insulate the cooling fins through the refrigerating machine and the vacuum box, thereby ensuring the relatively constant temperature on the surfaces of the cooling fins. The saturated nitrogen has heat exchange after contacting the cooling fins and is re-condensed into liquid nitrogen to re-enter the Dewar tank through the liquid nitrogen return pipe.

The present invention ingeniously pumps the phase-change nitrogen out of the Dewar tank through the siphoning effect, so that the immersion cooling of the high-temperature superconducting bulk is separated from the re-condensation of the phase-change saturated nitrogen, the nitrogen and liquid nitrogen are always in a process of continuous circulation compared with the liquid nitrogen immersion cooling method in the existing cooling technology of the high-temperature superconducting magnetic levitation vehicle, the gathering of the high-temperature nitrogen in the Dewar tank can be avoided effectively; meanwhile, the condensed liquid nitrogen can be returned for replenishing the loss of the liquid nitrogen caused by the phase change, thereby ensuring the constant internal temperature of the Dewar tank, and ensuring the cooling effect on the high-temperature superconductor; and moreover, due to the small loss of liquid nitrogen, it is unnecessary to replenish the liquid nitrogen regularly, so that the running efficiency of the cooling apparatus can be improved greatly.

According to the present invention, the high-temperature nitrogen is condensed into liquid nitrogen through the cooling fins, and then the high-temperature superconducting bulk is cooled by the liquid nitrogen, so that compared with the method for directly cooling the high-temperature superconducting bulk through the refrigerating machine in the prior art, the present invention performs the cooling directly through the liquid nitrogen at a preheat phase of the refrigerating machine, which can effectively avoid the unfavorable impact of the preheat of the refrigerating machine on the working efficiency of the cooling apparatus.

Secondly, the contact area between the saturated nitrogen and the cooling fins and the contact area between the liquid nitrogen and the high-temperature superconducting bulk are larger, so that the heat can be transferred to the liquid nitrogen rapidly from the high-temperature superconducting bulk, and then the heat is transferred to the cooling fins through the nitrogen; however, in the traditional structure that the high-temperature superconducting bulk directly contacts the cold head of the refrigerating machine, the contact area is limited; because the structure is formed by connecting two separated components, a connection gap is inevitably formed between the two, which further reduces the heat transfer efficiency, so that compared with the direct cooling of the refrigerating machine, the heat efficiency of the present invention is higher.

At the same time, the present invention adopts the saturated nitrogen and liquid nitrogen as refrigerant, which can be a better fit to the cooling equipment to realize the heat transfer due to the mobility; and therefore, no additional auxiliary heat conduction equipment is needed, and the volume of the equipment can be minimized, thereby reducing the space of the high-temperature superconducting magnetic levitation vehicle occupied by the equipment, meeting the high requirement of the vehicle on the size of the equipment, and having wider application range.

Therefore, through the working method for pumping the nitrogen through the siphoning effect and re-condensing the nitrogen through the refrigerating machine, the present invention integrates the advantages of the good cooling effect of the liquid nitrogen immersion cooling and good working continuity of the refrigerating machine cooling, and overcomes the main defects of the two methods, so that the continuous stable work of the high-temperature superconducting bulk can be ensured, and the manual maintenance period of the high-temperature superconducting magnetic levitation vehicle can be shortened, thereby improving the running efficiency of the high-temperature superconducting magnetic levitation vehicle.

2. The flexible isolation pipe of the present invention includes the inner pipe and the outer pipe that are concentrically arranged and made of the corrugated pipe, and the thermal insulation layer is filled between the inner pipe and the outer pipe; a plurality of fixing sheets for supporting the nitrogen siphon pipe and the liquid nitrogen return pipe are arranged in the inner pipe, and the isolation gap is reserved between any two of the nitrogen siphon pipe, the liquid nitrogen return pipe and the inner pipe through the fixing sheets; on one hand, the inner pipe and the outer pipe with the corrugated pipe structure can maximally realize the damping, thereby protecting the nitrogen siphon pipe and the liquid nitrogen return pipe therein, and ensuring the stable work; on one hand, the isolation gap is reserved between any two of the nitrogen siphon pipe, the liquid nitrogen return pipe and the inner pipe by adopting the fixing sheets, so that the severe disturbance of the vehicle body movement for the pipeline in the running process of the high-temperature superconducting magnetic levitation vehicle can be avoided; and on the other hand, by arranging the inner pipe and outer pipe and the thermal insulation layer, an exposed portion of the nitrogen siphon pipe and the liquid nitrogen return pipe between the vacuum box and the Dewar tank can be wrapped, and can be thermally insulated to the external environment, so that the nitrogen can be prevented from having heat exchange with external environment in the pipeline conveying and liquid nitrogen return process, thereby improve the heat efficiency of the whole equipment, and ensuring the cooling quality of the equipment.

3. According to the present invention, a plurality of pipeline supporting sheets are uniformly arranged between the inner pipe and the outer pipe, and the thermal insulation layer is filled between the adjacent pipeline supporting sheets; the pipeline supporting sheets form a support between the inner pipe and the outer pipe, so that the concentricity between the inner pipe and the outer pipe is ensured, the dropping of the inner pipe under the action of the gravity is prevented from squeezing the thermal insulation layer between the two, and the direct contact between the inner pipe and the outer pipe is avoided; on one hand, the pipeline supporting sheets with special design can minimize the heat leakage and the cost; the pipeline supporting sheets can ensure the uniform distribution of the thermal insulation layer between the inner pipe and the outer pipe, thereby ensuring the thermal insulation effect of the thermal insulation layer; and on the other hand, the pipeline supporting sheets can also improve the structural strength of the flexible isolation pipe, thereby prolonging the service life.

4. The vacuum box of the present invention includes the box body and the top cover connected with each other, and the refrigerating machine is fixedly connected with the top over through the damper; the condensing tank includes the tank body, the top of the tank body is provided with the heat exchanger, and the cold head of the refrigerating machine passes through the top cover to be thermally connected with the heat exchanger; the above structure can simplify the structure of the equipment as far as possible on the premise of ensuring the basic functions, and the later maintenance of the equipment can also be facilitated; and at the same time, the vibration of the refrigerating machine when in work can be reduced by the damper, thereby protecting the vacuum box and equipment therein, and not only reducing the working noise, but also improving the working stability and reliability of the equipment.

5. According to the present invention, the cold head is provided with the heating pipe for controlling the output cold of the cold head, the heating pipe is also connected with the temperature controller for controlling the heating temperature, and the temperature of a contact end between the cold head and the heat exchanger is controlled through the heating of the heating pipe, thereby assisting the control of the output cold of the cold head, so that not only the temperature control can be more accurate, but also the temperature can be regulated rapidly, and the regulation and control efficiency of the equipment can be improved.

6. According to the present invention, the condensing tank is also provided with the liquid nitrogen replenishing pipe communicated with the external liquid nitrogen source, and the liquid nitrogen replenishing pipe is provided with the regulating stop valve; the liquid nitrogen replenishing pipe is also provided with the corrugated compensation pipe; under a working condition of insufficient liquid nitrogen, the liquid nitrogen can be replenished in time, thereby ensuring the normal running of the equipment; at the same time, the liquid nitrogen replenishing pipe can replenish the liquid nitrogen under the working condition of the equipment, so that compared with the traditional stop replenishing way, the operation is more convenient, thereby increasing the running period of the high-temperature superconducting magnetic levitation vehicle; and at the same time, the replenishing efficiency is higher, and the severe change of the temperature can be prevented effectively.

At the same time, the length of the liquid nitrogen replenishing pipe is regulated by the corrugated compensation pipe, so that not only the stability of the liquid nitrogen compensation pipe can be improved, but also the vibration resistance of the pipeline can also be improved.

7. According to the present invention, the condensing tank is also connected with the safety pipe communicated with the external environment, and the safety pipe is provided with the safety valve for controlling the connection/disconnection state thereof, so that when the internal pressure of the condensing tank increases suddenly, a pass to the external environment can be opened in time to complete the pressure relief, thereby ensuring the pressure stability in the condensing tank, and ensuring the safety; and meanwhile, the safety pipe is also connected with the first vacuum pipe in parallel, the first vacuum pipe is provided with the first stop valve, before the running of the equipment, the first vacuum pipe is connected with the vacuum pipe to pump the air in the pipe, thereby preventing a great amount of air from remaining inside the equipment.

8. According to the present invention, the vacuum box is also provided with the detecting pipe and the second vacuum pipe communicated with exterior, the detecting pipe is connected with the vacuum gauge and the aviation joint respectively, and the temperature sensor connected with the aviation joint is arranged in the vacuum box; the second vacuum pipe is provided with the second stop valve; various detecting sensors can be connected conveniently through the detecting pipe, thereby monitoring the environment inside the equipment, ensuring the stable running of the equipment, and maximally simplifying the equipment structure; and before the use, the air in the vacuum box is pumped by the vacuum pump and the second vacuum pipe, thereby preventing a great amount of air from remaining in the equipment, and improving the thermal insulation and isolation effect of the vacuum box.

9. The heat exchanger of the present invention includes the connecting seat, and a plurality of cooling fins are arranged uniformly on the connecting seat; the cross-section of each cooling fin is in an inverted triangular shape or an inverted trapezoidal shape, and a bevel angle of a side surface is 0.25°-0.5°; and when the nitrogen contacts the fin, the membrane-like condensation may occur on the wall, and condensed liquid may be spread along the cooling wall to form a layer of liquid membrane. At the time, the phase change heat subsequently released by the nitrogen must pass through the liquid membrane, and the layer of liquid membrane becomes the main heat transfer resistance, so that it is necessary to widen roots of the fins to make the wall incline to a certain extent, and the liquid membrane is thinned by the surface tension of the condensed liquid and even ripped, thereby ensuring direct contact between the nitrogen and the cooling fins, and improving the heat transfer efficiency; and the oblique angle range and root widening design of the cooling fins are calculated according to heat load generated by the actual running of the high-temperature superconducting magnetic levitation vehicle, so that the membrane-like condensation of the saturated nitrogen on the walls of the cooling fins can be ensured, the condensed liquid slides to the liquid nitrogen condensing tank under the action of the gravity, and is finally returned to the Dewar tank to replenish the liquid nitrogen for cooling.

Figure 1:
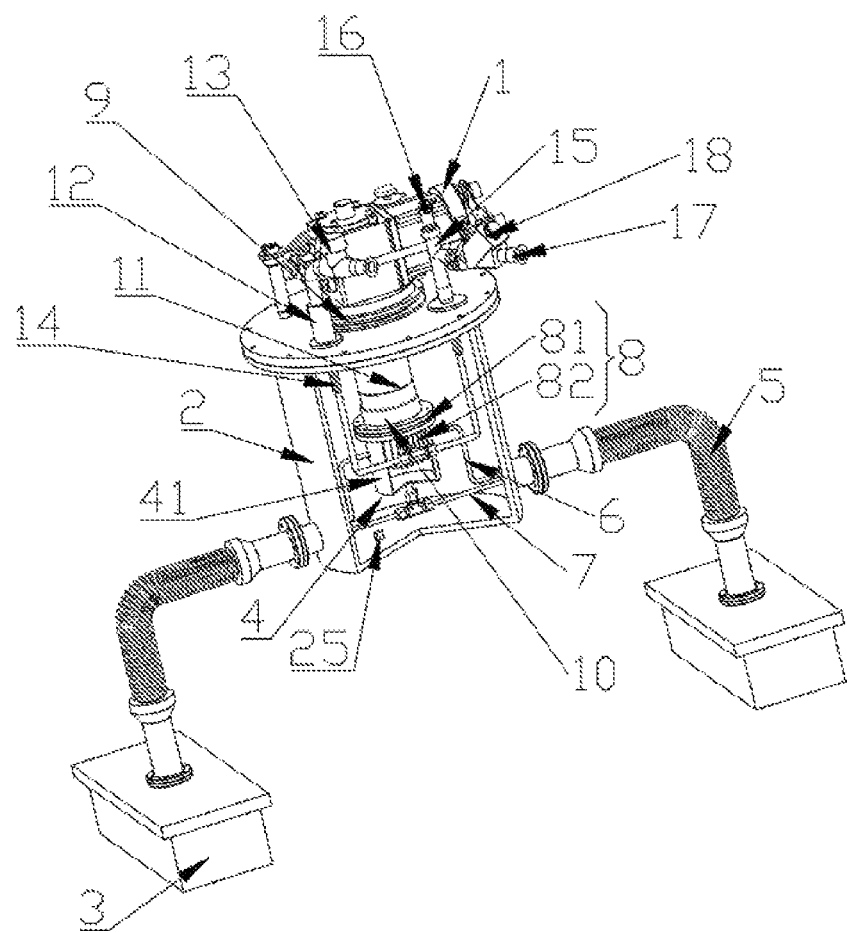
FIG. 1 is a structural schematic diagram of the present invention.
Figure 2:
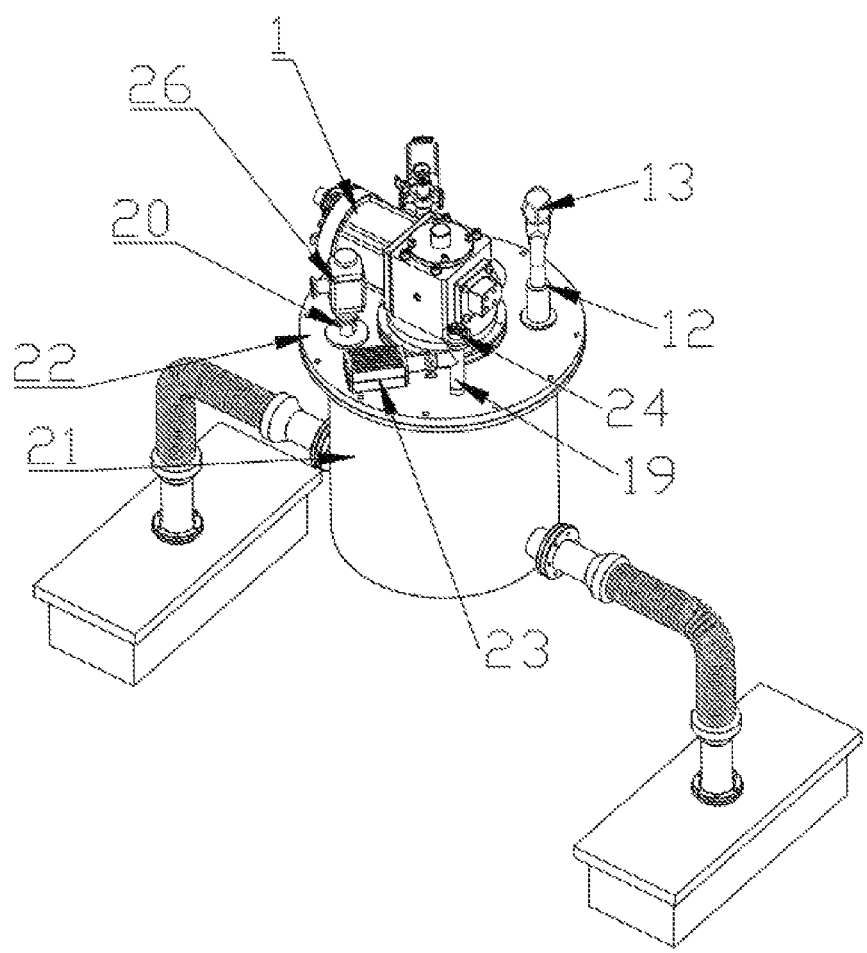
FIG. 2 is a rear structural schematic diagram of the present invention.
Figure 3:
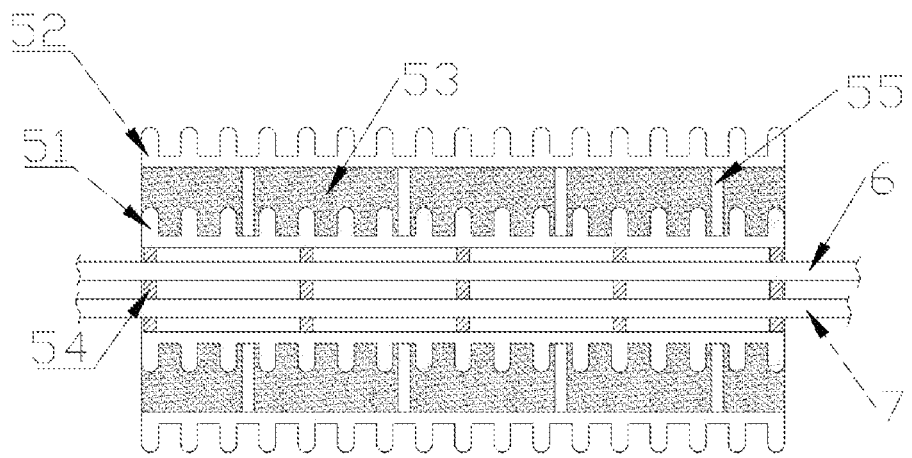
FIG. 3 is a structural schematic diagram of a flexible isolation pipe of the present invention.
Figure 4:
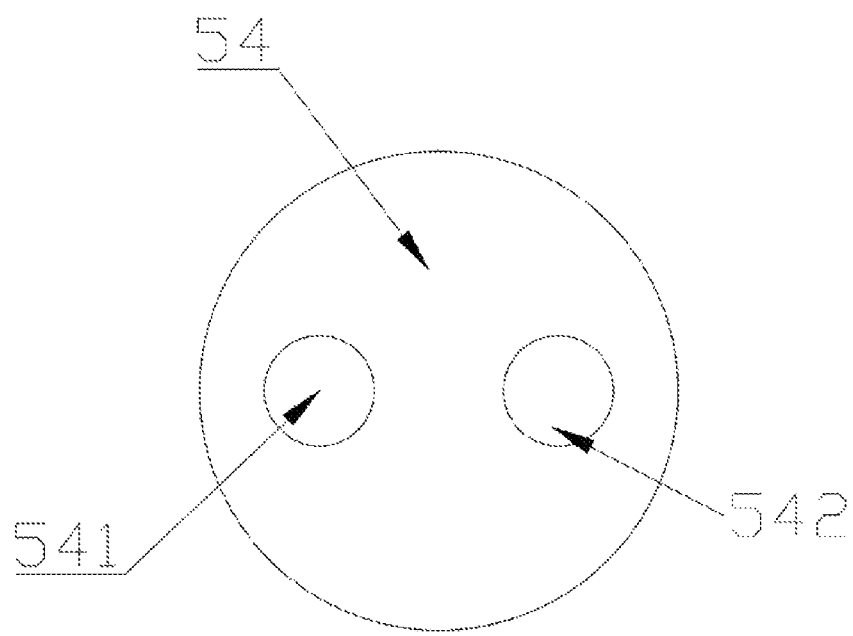
FIG. 4 is a structural schematic diagram of a fixing sheet of the present invention.

Reference numerals: 1, refrigerating machine; 2, vacuum box; 3, Dewar tank; 4, condensing tank; 5, flexible isolation pipe; 6, nitrogen siphon pipe; 7, liquid nitrogen return pipe; 8, heat exchanger; 9, damper; 10, heating pipe; 11, cold head; 12, liquid nitrogen replenishing pipe; 13, regulating stop valve; 14, corrugated compensation pipe; 15, safety pipe; 16, safety valve; 17, first vacuum pipe; 18, first stop valve; 19, detecting pipe; 20, second vacuum pipe; 21, box body; 22, top cover; 23, vacuum gauge; 24, aviation joint; 25, temperature sensor; 26, second stop valve; 41, tank body; 51, inner pipe; 52, outer pipe; 53, thermal insulation layer; 54, fixing sheet; 55, pipeline supporting sheet; 81, connecting seat; 82, cooling fin; 541, first installation hole; 542, second installation hole.

DETAILED DESCRIPTION OF THE PRESENT INVENTION

To make the purpose, technical solutions and advantages of embodiments of the present invention clearer, the technical solutions in the embodiments of the present invention are described clearly and completely below in combination with accompanying drawings in the embodiments of the present invention.

Embodiment 1

As shown in FIG. 1, the present embodiment provides a superconducting bulk cooling apparatus for a high-temperature superconducting magnetic levitation vehicle, which includes a refrigerating machine 1, a vacuum box 2 and a Dewar tank 3. The vacuum box 2 includes a box body 21 and a top cover 22 that are fixedly connected through a connecting flange. The refrigerating machine 1 is fixedly installed on the top cover 22. A damper 9 is also arranged between the refrigerating machine 1 and the top cover 22. The damper 9 adopts a rubber damping pad. The top cover 22 is also provided with a connecting hole, and a cold head 11 of the refrigerating machine 1 is inserted into the vacuum box 2 through the connecting hole.

A condensing tank 4 is also arranged in the vacuum box 2. The condensing tank 4 includes a tank body 41. The top of the tank body 41 is provided with an installation hole. A heat exchanger 8 is fixedly arranged in the installation hole. The heat exchanger 8 includes a connecting seat 81. A plurality of cooling fins 82 are uniformly arranged on the bottom surface of the connecting seat 81. The connecting seat 81 is fixedly connected with the tank body 41 through the installation hole. The cooling fins 82 are inserted into the tank body 41. One end of the connecting seat 81 located outside the condensing tank 4 is fixedly and thermally connected with the cold head 11 of the refrigerating machine 1 in the vacuum box 2. In order to rapidly control the heat of the cold head 11, the cold head 11 is wound with a heating pipe 10. The heating pipe 10 is also connected with a temperature controller for controlling the heating temperature thereof.

The side surface and the bottom surface of the tank body 41 are provided with a nitrogen inlet and a nitrogen outlet respectively. A nitrogen siphon pipe 6 and a liquid nitrogen return pipe 7 are also arranged between the Dewar tank 3 and the condensing tank 4. The Dewar tank 3 is provided with a nitrogen outlet and a liquid nitrogen return port. Two ends of the nitrogen siphon pipe 6 are connected with the nitrogen inlet and the nitrogen outlet of the condensing tank 4 and the Dewar tank 3 respectively in a closed manner. Two ends of the liquid nitrogen return pipe 7 are respectively connected with the liquid nitrogen outlet and the liquid nitrogen return port, and the outlet end of the liquid nitrogen return pipe 7 is immersed in liquid nitrogen in the Dewar tank 3. The condensing tank 4 and the Dewar tank 3 are communicated through the nitrogen siphon pipe 6 and the liquid nitrogen return pipe 7, and a closed nitrogen circulation loop is formed between the two.

Further, the end of the nitrogen siphon pipe 6 connected with the tank body 41 is right opposite to a cooling fin 82. A cross section of the cooling fin 82 is in an inverted triangular shape or an inverted trapezoidal shape according to the actual running requirement of the high-temperature superconducting magnetic levitation vehicle, and an oblique angle of a side surface is 0.25°-0.5°. Meanwhile, in order to increase the diffusion speed of the nitrogen and improve the condensation effect, the cooling fin 82 may also be provided with a plurality of via holes. The nitrogen siphon pipe 6 passes through the via holes to be inserted into the cooling fin 82. A plurality of ventilation holes are uniformly arranged on a portion of the nitrogen siphon pipe 6 located between the cooling fins 82, so that the nitrogen is uniformly and rapidly conveyed to between the cooling fins 82, and the nitrogen is prevented from being concentrated at one side of a heat radiator 8.

A flexible isolation pipe 5 is also connected between the vacuum box 2 and the Dewar tank 3. The flexible isolation pipe 5 includes an inner pipe 51 and an outer pipe 52. Both the inner pipe 51 and the outer pipe 52 are made of a corrugated pipe and are concentrically arranged. A plurality of pipeline supporting sheets 55 are uniformly arranged between the inner pipe 51 and the outer pipe 52. A distance among the pipeline supporting sheets 55 is preferably 20 cm. Two sides of the pipeline supporting sheets 55 contact the inner wall of the outer pipe 52 and the outer wall of the inner pipe 51 respectively, thereby providing support in a radial direction, and ensuring that the inner pipe 51 and the outer pipe 52 are arranged concentrically. A thermal insulation layer 53 is filled between two pipeline supporting sheets 55, thereby improving the thermal insulation effect of the flexible isolation pipe 5. The nitrogen siphon pipe 6 and the liquid nitrogen return pipe 7 pass through the inner pipe 51 to be connected with the condensing tank 4 and the Dewar tank 3 respectively. A plurality of fixing sheets 54 are uniformly arranged in the inner pipe 51. A distance among the fixing sheets 54 is preferably 25 cm. The periphery of the fixing sheet 54 uniformly contacts the inner wall of the inner pipe 51, thereby providing the support in the radial direction. The fixing sheet 54 is provided with a first installation hole 541 and a second installation hole 542 that are separated from each other, and the nitrogen siphon pipe 6 and the liquid nitrogen return pipe 7 pass through the first installation hole 541 and the second installation hole 542 respectively, so that the nitrogen siphon pipe 6 and the liquid nitrogen return pipe 7 are fixed, and a sufficient isolation gap is ensured to be reserved between the nitrogen siphon pipe 6 and the liquid nitrogen return pipe 7, between the nitrogen siphon pipe 6 and the inner pipe 51 and between the inner pipe 51 and the liquid nitrogen return pipe 542, thereby avoiding the heat transfer caused by the mutual contact.

Further, the top cover 22 of the vacuum box 2 is also provided with a detecting pipe 19 and a second vacuum pipe 20. The interior of the vacuum box 2 is communicated with the exterior through the detecting pipe 19 and the second vacuum pipe 20. The detecting pipe 19 is connected with an aviation joint 24 and a vacuum gauge 23 for detecting a vacuum degree in the box in parallel. A temperature sensor 25 connected with the aviation joint 24 is arranged in the vacuum box 2. The second vacuum pipe 20 is provided with a second stop valve 26, and the connection and disconnection state of the second vacuum pipe is controlled by the second stop valve 26. When in use, the vacuum pump vacuumizes the vacuum box 2 through the second vacuum pipe 20.

A liquid nitrogen replenishing pipe 12, a safety pipe 15 and a first vacuum pipe 17 are also arranged in the vacuum box 2. One end of each of the liquid nitrogen replenishing pipe 12, the safety pipe 15 and the first vacuum pipe 17 passes through the top cover 22 to extend out of the vacuum box 2. A regulating stop valve 13 is arranged on one end of the liquid nitrogen replenishing pipe 12 located outside the vacuum box 2. A safety valve 16 and a first stop valve 18 are arranged respectively on one end of each of the safety pipe 15 and the first vacuum pipe 17 located outside the vacuum box 2. One end of each of the liquid nitrogen replenishing pipe 12, the safety pipe 15 and the first vacuum pipe 17 located in the vacuum box 2 are communicated with the condensing tank 4 respectively. Meanwhile, a corrugated compensation pipe 14 is also arranged at one section of the liquid nitrogen replenishing pipe 12 located in the vacuum box 2, thereby compensating the pipeline shrinkage caused by the temperature change.

Further, the liquid nitrogen replenishing pipe 12 and the safety pipe 15 are communicated with the condensing tank 4 through a three-way pipe.

Embodiment 2

As a basic embodiment of the present invention, the present embodiment discloses a superconducting bulk cooling method for a high-temperature superconducting magnetic levitation vehicle, which includes the following steps:

S1, high-temperature superconducting bulks are placed into a Dewar tank;

S2, liquid nitrogen is poured into the Dewar tank until the high-temperature superconducting bulk is completely immersed, and all pipelines are closed by stop valves;

S3, a vacuum pump is connected with a first vacuum pipe, a first stop valve is opened at the same time, and a vacuum box is vacuumized by the vacuum pump, after a vacuum degree is qualified through the detection of a vacuum gauge, relevant operations are stopped, and the first stop valve is closed; then the vacuum pump is connected with a second vacuum pipe, a second stop valve is opened at the same time, the condensing tank, a nitrogen siphon pipe and a liquid nitrogen return pipe are vacuumized by the vacuum pump, and the second stop valve is closed after the operation is finished;

S4, a refrigerating machine is started, the temperature in the condensing tank is reduced by the refrigerating machine, and the temperature in the tank is ensured to be stabilized at a nitrogen liquefied temperature through the detection of a temperature sensor; and saturated nitrogen generated by the phase change in a cooling process of the high-temperature superconducting bulk is pumped into the condensing tank through a siphon effect, the heat-exchanged re-condensed liquid nitrogen is returned to the Dewar tank through the liquid nitrogen return pipe to replenish the liquid nitrogen for cooling.

When the present invention is in use, the Dewar tank is filled with the liquid nitrogen for cooling, and the high-temperature superconducting bulk is immersed in the liquid nitrogen of the Dewar tank for cooling, and the temperature of the liquid nitrogen increases in the process of cooling the high-temperature superconducting bulk, so that partial liquid nitrogen is phase-changed to the saturated nitrogen, and the pressure in the Dewar tank increases continuously; at the same time, the condensing tank is isolated from the external environment through a vacuum cooling method, and the cooling fins of the condensing tank are cooled through the refrigerating machine, so that the temperature of the cooling fins is reduced to the nitrogen liquefied temperature through the refrigeration of the refrigerating machine. Because of the pressure difference between the condensing tank and the Dewar tank, the siphoning effect occurs between the condensing tank and the Dewar tank, the saturated nitrogen may overcome the surface tension thereof to automatically enter the condensing tank through the nitrogen siphon pipe and to contact the cooling fins, after the heat exchange, the gaseous nitrogen is condensed into liquid, and the liquid nitrogen is returned to the Dewar tank through the liquid nitrogen return pipe on the bottom of the condensing tank.

The present invention ingeniously utilizes the siphoning effect to naturally separate the saturated nitrogen from the liquid nitrogen; and the saturated nitrogen is re-condensed through the external refrigerating equipment, and in the working process of the equipment, the saturated nitrogen and the liquid nitrogen are always in a process of dynamic circulation.

Compared with the traditional liquid nitrogen immersion cooling method, the saturated nitrogen may be pumped in time, so that the high-temperature saturated nitrogen is prevented from affecting the internal temperature of the Dewar tank; and at the same time, the re-condensed liquid nitrogen is returned to the Dewar tank to ensure the stability of the liquid nitrogen quantity in the Dewar tank. Through the above measures, the temperature in the Dewar tank can be ensured to be stable relatively, and it is unnecessary to replenish additional liquid nitrogen regularly, thereby improving the working efficiency of the equipment greatly, and improving the running efficiency of the high-temperature superconducting magnetic levitation vehicle greatly.

Compared with the traditional refrigerating machine cooling mode, the present invention changes a traditional heat conduction method that the refrigerating machine is directly connected with the superconducting bulk, and adopts the nitrogen and liquid nitrogen as refrigerant, so that compared with the direct connection method, the mobility of the nitrogen and liquid nitrogen is better and can better contact the cold head of the refrigerating machine and the superconducting bulk, the contact area is increased, and the heat efficiency is further improved; and meanwhile, it is unnecessary to add the additional equipment to increase the contact area between the refrigerating machine and the superconducting bulk, thereby greatly simplifying the structure of the equipment, and improving the overall structural compactness of the high-temperature superconducting magnetic levitation vehicle.

Therefore, by pumping the nitrogen through the siphoning effect and through the working method of the refrigerating machine for re-condensing the nitrogen, the present invention integrates the advantages of good cooling effect of the liquid nitrogen immersion cooling and good working continuity of the refrigerating machine cooling, overcomes the main defects of the two, and can ensure the continuous stable work of the high-temperature superconducting bulk.

At the same time, the structural design and parameter selection of all components in the present invention are based on the high-temperature superconducting magnetic levitation vehicle, so that the manual maintenance period of the high-temperature superconducting magnetic levitation vehicle can be shortened on the premise of ensuring the normal running of the high-temperature superconducting magnetic levitation vehicle, the manual maintenance difficulty is reduced, and the running efficiency of the high-temperature superconducting magnetic levitation vehicle is improved greatly, thereby further promoting the engineering application of the high-temperature superconducting magnetic levitation vehicle.

What is claimed is:

1. A superconducting bulk cooling apparatus for a high-temperature superconducting magnetic levitation vehicle, comprising a refrigerating machine (1), a vacuum box (2) and a Dewar tank (3), wherein a condensing tank (4) is arranged in the vacuum box (2), and the condensing tank (4) is thermally insulated from an external environment through the vacuum box (2);

the Dewar tank (3) is communicated with the vacuum box (2) through a flexible isolation pipe (5), and a nitrogen siphon pipe (6) and a liquid nitrogen return pipe (7) that are independent from each other are arranged in the flexible isolation pipe (5);

and the Dewar tank (3) is communicated with the condensing tank (4) through the nitrogen siphon pipe (6) and the liquid nitrogen return pipe (7) to form a closed nitrogen conversion and circulation loop;

a heat exchanger (8) for performing heat exchange and condensation on gaseous nitrogen is arranged in the condensing tank (4), and the heat exchanger (8) is fixedly and thermally connected with the refrigerating machine (1);

when the superconducting bulk cooling apparatus for a high-temperature superconducting magnetic levitation vehicle is in use, the high-temperature superconducting bulk is immersed in the liquid nitrogen of the Dewar tank (3), and the temperature of the liquid nitrogen increases in the process of cooling the high-temperature superconducting bulk, so that partial liquid nitrogen is phase-changed to the saturated nitrogen, and the pressure in the Dewar tank (3) increases continuously; the siphoning effect occurs between the condensing tank and the Dewar tank, the saturated nitrogen may overcome the surface tension thereof to automatically enter the condensing tank (4) through the nitrogen siphon pipe (6) and to contact the heat exchanger (8), the gaseous nitrogen is condensed into liquid, and the liquid nitrogen is returned to the Dewar tank (3) through the liquid nitrogen return pipe (7);

the heat exchanger (8) comprises a connecting seat (81), and a plurality of cooling fins (82) are uniformly arranged on the connecting seat (81); and a cross section of each cooling fin (82) is in an inverted triangular shape or an inverted trapezoidal shape, and an oblique angle of a side surface is 0.25°-0.5°; and the cooling fin (82) is provided with a plurality of via holes, the nitrogen siphon pipe passes through the via holes to be inserted into the cooling fin (82), and a plurality of ventilation holes are uniformly arranged on a portion of the nitrogen siphon pipe located between the cooling fins (82).

2. The superconducting bulk cooling apparatus for the high-temperature superconducting magnetic levitation vehicle according to claim 1, wherein the flexible isolation pipe (5) comprises an inner pipe (51) and an outer pipe (52) made of a corrugated pipe, the inner pipe (51) and the outer pipe (52) are concentrically arranged, and a thermal insulation layer (53) is filled between the inner pipe (51) and the outer pipe (52); and a plurality of fixing sheets (54) having special structures for supporting the nitrogen siphon pipe (6) and the liquid nitrogen return pipe (7) are arranged in the inner pipe (51), and an isolation gap is reserved between any two of the nitrogen siphon pipe (6), the liquid nitrogen return pipe (7) and the inner pipe (51) through the fixing sheets (54).

3. The superconducting bulk cooling apparatus for the high-temperature superconducting magnetic levitation vehicle according to claim 2, wherein a plurality of pipeline supporting sheets (55) are uniformly arranged between the inner pipe (51) and the outer pipe (52), and the thermal insulation layer (53) is filled between pipeline supporting sheets (55).

4. The superconducting bulk cooling apparatus for the high-temperature superconducting magnetic levitation vehicle according to claim 1, wherein the vacuum box (2) comprises a box body (21) and a top cover (22) that are connected with each other; the refrigerating machine (1) is fixedly connected with the top cover (22) through a damper (9); the condensing tank (4) comprises a tank body (41), the top of the tank body (41) is provided with a heat exchanger (8), and a cold head (11) of the refrigerating machine (1) passes through the top cover (22) to be thermally connected with the heat exchanger (8).

5. The superconducting bulk cooling apparatus for the high-temperature superconducting magnetic levitation vehicle according to claim 4, wherein the cold head (11) is provided with a heating pipe (10) for controlling the output cold thereof, and the heating pipe (10) is also connected with a temperature controller for controlling the heating temperature.

6. The superconducting bulk cooling apparatus for the high-temperature superconducting magnetic levitation vehicle according to claim 1, wherein the condensing tank (4) is also provided with a liquid nitrogen replenishing pipe (12) communicated with an external liquid nitrogen source; the liquid nitrogen replenishing pipe (12) is provided with a regulating stop valve (13); and the liquid nitrogen replenishing pipe (12) is also provided with a corrugated compensation pipe (14).

7. The superconducting bulk cooling apparatus for the high-temperature superconducting magnetic levitation vehicle according to claim 1, wherein the condensing tank (4) is also connected with a safety pipe (15) communicated with the external environment; the safety pipe (15) is provided with a safety valve (16) for controlling a connection/disconnection state thereof; and the safety pipe is also connected with a first vacuum pipe (17) in parallel, and the vacuum pipe (17) is provided with a first stop valve (18).

8. The superconducting bulk cooling apparatus for the high-temperature superconducting magnetic levitation vehicle according to claim 1, wherein the vacuum box (2) is also provided with a detecting pipe (19) and a second vacuum pipe (20) that are communicated with the exterior; the detecting pipe (19) is connected with a vacuum gauge (23) and an aviation joint (24) respectively; a temperature sensor (25) connected with the aviation joint (24) is arranged in the vacuum box (2); and the second vacuum pipe (20) is provided with a second stop valve (26).

9. The superconducting bulk cooling apparatus for the high-temperature superconducting magnetic levitation vehicle according to claim 1, wherein an outlet end of the nitrogen siphon pipe (6) is right opposite to the cooling fins (82).

10. A superconducting bulk cooling method for a high-temperature superconducting magnetic levitation vehicle, comprising the following steps:
   S1, placing high-temperature superconducting bulks into a Dewar tank;
   S2, connecting a vacuum pump with a first vacuum pipe, opening a first stop valve, vacuumizing a vacuum box through the vacuum pump, stopping relevant operations after the vacuum degree is qualified through the detection with a vacuum gauge, and closing the first stop valve;
   S3, connecting the vacuum pump with a second vacuum pipe, opening a second stop valve, vacuumizing a condensing tank, a nitrogen siphon pipe and a liquid nitrogen return pipe through the vacuum pump, and closing the second stop valve after finishing the S3 operation;
   S4, starting a refrigerating machine, reducing the internal temperature of the condensing tank through the refrigerating machine, and detecting the temperature through a temperature sensor to ensure that the temperature in the tank is stabilized at a nitrogen liquefied temperature; pumping saturated nitrogen generated by the phase change in a cooling process of the superconducting bulk into the condensing tank through a siphon effect, condensing the nitrogen into liquid nitrogen, and returning the liquid nitrogen into the Dewar tank through the liquid nitrogen return pipe to replenish the liquid nitrogen for cooling.

* * * * *